(12) United States Patent
Brown

(10) Patent No.: US 9,064,072 B2
(45) Date of Patent: Jun. 23, 2015

(54) MODELING SEMICONDUCTOR DEVICE PERFORMANCE

(75) Inventor: Jeffrey S. Brown, Berlin, VT (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 13/562,393

(22) Filed: Jul. 31, 2012

(65) Prior Publication Data
US 2014/0039863 A1 Feb. 6, 2014

(51) Int. Cl.
*G06F 17/50* (2006.01)

(52) U.S. Cl.
CPC ........ *G06F 17/5036* (2013.01); *G06F 17/5068* (2013.01); *G06F 17/5081* (2013.01); *G06F 17/50* (2013.01)

(58) Field of Classification Search
None
See application file for complete search history.

(56) References Cited

U.S. PATENT DOCUMENTS

| | | | |
|---|---|---|---|
| 6,314,390 B1 * | 11/2001 | Bittner et al. | 703/14 |
| 6,553,339 B1 | 4/2003 | Komatsubara | |
| 6,735,558 B1 | 5/2004 | Yamaguchi | |
| 7,228,516 B2 | 6/2007 | Cui et al. | |
| 7,542,891 B2 | 6/2009 | Lin et al. | |
| 7,584,438 B2 * | 9/2009 | Moroz et al. | 716/136 |
| 7,630,850 B2 | 12/2009 | Topaloglu et al. | |
| 7,761,278 B2 * | 7/2010 | Chidambarrao et al. | 703/14 |
| 7,932,563 B2 | 4/2011 | Ho et al. | |
| 7,996,202 B2 | 8/2011 | Bianchi | |
| 8,037,433 B2 | 10/2011 | Chidambarrao et al. | |
| 8,370,774 B2 * | 2/2013 | Tsai et al. | 703/14 |
| 2009/0089037 A1 * | 4/2009 | Yamada | 703/14 |
| 2011/0077917 A1 | 3/2011 | Fujii et al. | |
| 2011/0313748 A1 | 12/2011 | Li | |

FOREIGN PATENT DOCUMENTS

JP 2004327463 A * 11/2004 ............ H01L 21/336

OTHER PUBLICATIONS

Wang, Chi-Chao, et al. "Compact Modeling of Stress Effects in Scaled CMOS" IEEE, Int'l Conf. on Simulation of Semiconductor Processes & Devices, SISPAD '09 (2009) available from <http://ieeexplore.ieee.org/xpls/abs_all.jsp?arnumber=5290231>.*

(Continued)

*Primary Examiner* — Kamini S Shah
*Assistant Examiner* — Jay B Hann
(74) *Attorney, Agent, or Firm* — Gibb & Riley, LLC; Anthony J. Canale

(57) ABSTRACT

Disclosed are embodiments for modeling semiconductor device performance using a single compact model despite changes in performance attribute to model parameter dependency of a single semiconductor device that occur during fitting and/or re-centering due to local layout effects (LLEs) and despite variations in this dependency across multiple related semiconductor devices due to LLEs. In one embodiment, the actual performance attribute to model parameter dependence of a single semiconductor device is fit to a reference dependence so that changes to the compact model are not required even when changes occur in the performance attribute to model parameter dependency during fitting and/or re-centering. In another embodiment, the actual performance attribute to model parameter dependence of each of multiple related semiconductor devices are fit to a reference dependence so that changes to the compact model are not required even when the performance attribute to model parameter dependency varies across the devices.

18 Claims, 7 Drawing Sheets

(56) References Cited

OTHER PUBLICATIONS

Faricelli, John "Layout-Dependent Proximity Effects in Deep Nanoscale CMOS" IEEE, Custom Integrated Circuits Conference, CICC (2010) available from <http://ieeexplore.ieee.org/xpls/abs_all.jsp?arnumber=5617407>.*

Morshed, T. H., et al., "BSIM4.6.4 MOSFET model users manual," U. California Berkeley (2009).*

The Free Dictionary <http://www.thefreedictionary.com/data=point> (accessed Dec. 1, 2014).*

Wang, Chi-Chao "Modeling of Layout-Dependent Stress Effects in CMOS Design" ICCAD'09, pp. 513-520 (2009) available from <http://dl.acm.org/citation.cfm?id=1687496>.* deSouza, et al., "Study of Matching Properties of Graded-Channel SOI MOSFETs," Journal Integrated Circuits and Systems 2008, vol. 3, No. 2, pp. 69-75.

Pham, et al, "Physics-Based Modeling of Hole Inversion—Layer Mobility in Strained-SiGe-on-Insulator," IEEE Transactions on Electron Devices, vol. 54, No. 9, Sep. 2007, pp. 2174-2182.

Remashan, et al., "Modeling Inversion-Layer Carrier Mobilities in all Regions of MOSFET Operation," Solid-State Electronics 46, 2002, pp. 153-156.

Platania, et al., "A Physics-Based Model for a SiC JFET Accounting for Electric-Field-Dependent Mobility," IEEE Transactions on Industry Applications, vol. 47, No. 1, Jan./Feb. 2011, pp. 199-211.

Chaudhry, et al., "Mobility Modeling in a p-MOSFET under Uniaxial Stress," Elektrotehniski Vestnik, vol. 78, No. 5, 2011, pp. 298-303.

Chakraborty, et al., "Layout Level Timing Optimization by Leveraging Active ARea Dependent Mobility of Strained-Silicon Devices," EDAA, 2008, pp. 1-7.

Springer et. al., "Modeling of Variation in Submicrometer CMOS ULSI Technologies," IEEE Trans on Elect. Devices, vol. 53, No. 9, Sep. 2006, pp. 2168-2178.

\* cited by examiner

MODELING SEMICONDUCTOR DEVICE PERFORMANCE

BACKGROUND

1. Field of the Invention

The embodiments disclosed herein relate to modeling semiconductor device performance and, more particularly, to embodiments of a method, a system and a program storage device for modeling semiconductor device performance using a single compact model, without selective adjustments, despite changes in performance attribute to model parameter dependency of a single semiconductor device that occur during fitting and/or re-centering due to local layout effects (LLEs) and/or despite variations in performance attribute to model parameter dependency across multiple related semiconductor devices.

2. Description of the Related Art

Oftentimes in integrated circuit design, semiconductor device performance and, particularly, field effect transistor (FET) performance, is optimized through the use of strain engineering. For example, strain engineering can be used to alter charge carrier mobility in the channel region of a FET and, thereby alter a performance attribute (e.g., linear drain current (Idlin)) of the FET. However, since the strain imparted on a FET channel region can vary as a function of the FET's proximity to other structures (e.g., isolation regions) or other devices in the design layout, the charge carrier mobility of essentially identical FETs and, thereby the performance of those FETs can vary as a function of placement. This phenomenon is referred to as the local layout effect (LLE).

Many compact models incorporate equations that use mobility multipliers in an attempt to account for local layout effects (LLEs). These equations typically assume that variations of linear drain current (Idlin) (e.g., as indicated by a percentage change) as a function of variations in mobility (e.g., as indicated by a mobility multiplier) will be essentially the same for related FETs (i.e., for all FETs of the same type, such as for all P-type field effect transistors (PFETs) or all N-type field effect transistors (NFETs), having essentially the same geometry, but different threshold voltages). However, it has been found that linear drain current (Idlin) to mobility (u0) dependency can vary significantly for a given FET model during model fitting and centering, and can vary significantly between related FET models depending on the choice of fitting parameters used to fit each model. Similar results have been found with regard to the performance attribute to model parameter dependencies (e.g., the percentage change in saturation drain current (Idsat) as a function of saturation velocity (Vsat)). Thus, the compact model being used to model LLEs must be selectively adjusted during fitting and/or centering for a single FET or for each of the related FETs or, alternatively, different compact models must be used for each of the related FETs. Unfortunately, such solutions can be time-consuming and costly. Therefore, it would be advantageous to provide a technique that allows a single compact model to be used, without selective adjustments, despite changes in performance attribute to model parameter dependency of a single semiconductor device due to local layout effects during fitting and/or re-centering and/or despite variations in performance attribute to model parameter dependency across multiple related semiconductor devices.

SUMMARY

In view of the foregoing, disclosed herein are embodiments of a method, system and program storage device for modeling semiconductor device performance using a single compact model, without selective adjustments, despite changes in performance attribute to model parameter dependency of a single semiconductor device (e.g., despite changes in linear drain current (Idlin) to mobility (u0) dependency of a field effect transistor (FET) or changes in saturation drain current (Idsat) to saturation velocity (Vsat) dependency of a FET) that occur during fitting and/or re-centering due to local layout effects (LLEs) and/or despite variations in performance attribute to model parameter dependency across multiple related semiconductor devices (e.g., despite variations in linear drain current (Idlin) to mobility (u0) dependency across related FETs or variations in saturation drain current (Idsat) to saturation velocity (Vsat) dependency across related FETs) due to local layout effects (LLEs). Specifically, the actual performance attribute to model parameter dependence of a single semiconductor device can be fit to a reference dependence so that changes to the compact model used to model performance are not required even when changes occur in the performance attribute to model parameter dependency during fitting and/or re-centering. Furthermore, the actual performance attribute to model parameter dependence of each of multiple related semiconductor devices can be fit to a reference dependence so that changes to the compact model used to model performance are not required even when the performance attribute to model parameter dependency varies across the devices. In this case, the reference dependence can optionally be the performance attribute to model parameter dependence of a selected one of the related semiconductor devices.

More particularly, disclosed herein are embodiments of a computer-implemented method for modeling semiconductor device performance (e.g., for modeling field effect transistor performance).

The method can comprise accessing (e.g., by a computer from memory) a set of data points indicating, for a single semiconductor device, the dependence of a performance attribute on a model parameter. For example, each data point can indicate the percentage change in a performance attribute as a function of a multiplier associated with the model parameter. In one embodiment, the semiconductor device can comprise a field effect transistor (FET), the performance attribute can comprise linear drain current (Idlin) and the model parameter can comprise mobility (u0). In another embodiment, the semiconductor device can comprise a field effect transistor (FET), the performance attribute can comprise saturation drain current (Idsat) and the model parameter can comprise saturation velocity (Vsat).

Then, the model parameter in the set can be adjusted (e.g., by the computer) so that the actual performance attribute to model parameter dependence of the semiconductor device matches a reference dependence. By fitting the actual performance attribute to model parameter dependence of the semiconductor device to a reference dependence, changes to the compact model used to model performance are not required even when changes occur in the performance attribute to model parameter dependency during fitting and/or re-centering.

In addition, the method can comprise accessing (e.g., by the computer from memory) multiple sets of data points, where each set is associated with a corresponding one of multiple related semiconductor devices and indicates a corresponding performance attribute to model parameter dependence and where the corresponding dependence is different for different semiconductor devices.

In this case, the model parameter in each of the multiple sets of data points can be adjusted (e.g., by the computer) such that, for all of the multiple related semiconductor devices, the corresponding performance attribute to model parameter dependence matches the reference dependence in the same manner as described above. Optionally, this reference dependence can be the corresponding dependence of a selected one of the semiconductor devices. By fitting the actual performance attribute to model parameter dependence of each semiconductor device to the reference dependence, changes to the compact model used to model performance are not required even when the performance attribute to model parameter dependency varies across the devices.

Also disclosed herein are embodiments of a computer system for modeling semiconductor device performance (e.g., for modeling field effect transistor performance). The computer system can comprise a memory that stores a set of data points indicating, for a single semiconductor device, the dependence of a performance attribute on a model parameter. For example, each data point can indicate the percentage change in a performance attribute as a function of a multiplier associated with the model parameter. In one embodiment, the semiconductor device can comprise a field effect transistor (FET), the performance attribute can comprise linear drain current (Idlin) and the model parameter can comprise mobility (u0). In another embodiment, the semiconductor device can comprise a field effect transistor (FET), the performance attribute can comprise saturation drain current (Idsat) and the model parameter can comprise saturation velocity (Vsat).

The computer system can further comprise at least one processor. This processor can access the set of data points in the memory and can adjust the model parameter in the set so that the performance attribute to model parameter dependence matches a reference dependence. By fitting the actual performance attribute to model parameter dependence of the semiconductor device to a reference dependence, changes to the compact model used to model performance are not required even when changes occur in the performance attribute to model parameter dependency during fitting and/or re-centering.

In addition, the memory can store multiple sets of data points, where each set is associated with a corresponding one of multiple related semiconductor devices and indicates a corresponding dependence of the performance attribute on the model parameter and where the corresponding dependence is different for different semiconductor devices. In this case, the processor can, in the same manner as described above, access the multiple sets of data points in the memory and can adjust the model parameter in each of the multiple sets of data points so that, for all of the multiple related semiconductor devices, the corresponding performance attribute to model parameter dependence matches the reference dependence. Optionally, this reference dependence can be the corresponding dependence of a selected one of the semiconductor devices. By fitting the actual performance attribute to model parameter dependence of each semiconductor device to the reference dependence, changes to the compact model used to model performance are not required even when the performance attribute to model parameter dependency varies across the devices.

Also disclosed herein are embodiments of a computer program product. This computer program product can comprise a computer readable medium having computer readable program code embodied therewith. The computer readable program code can be executable by a computer to perform the above-described method of modeling semiconductor device performance.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
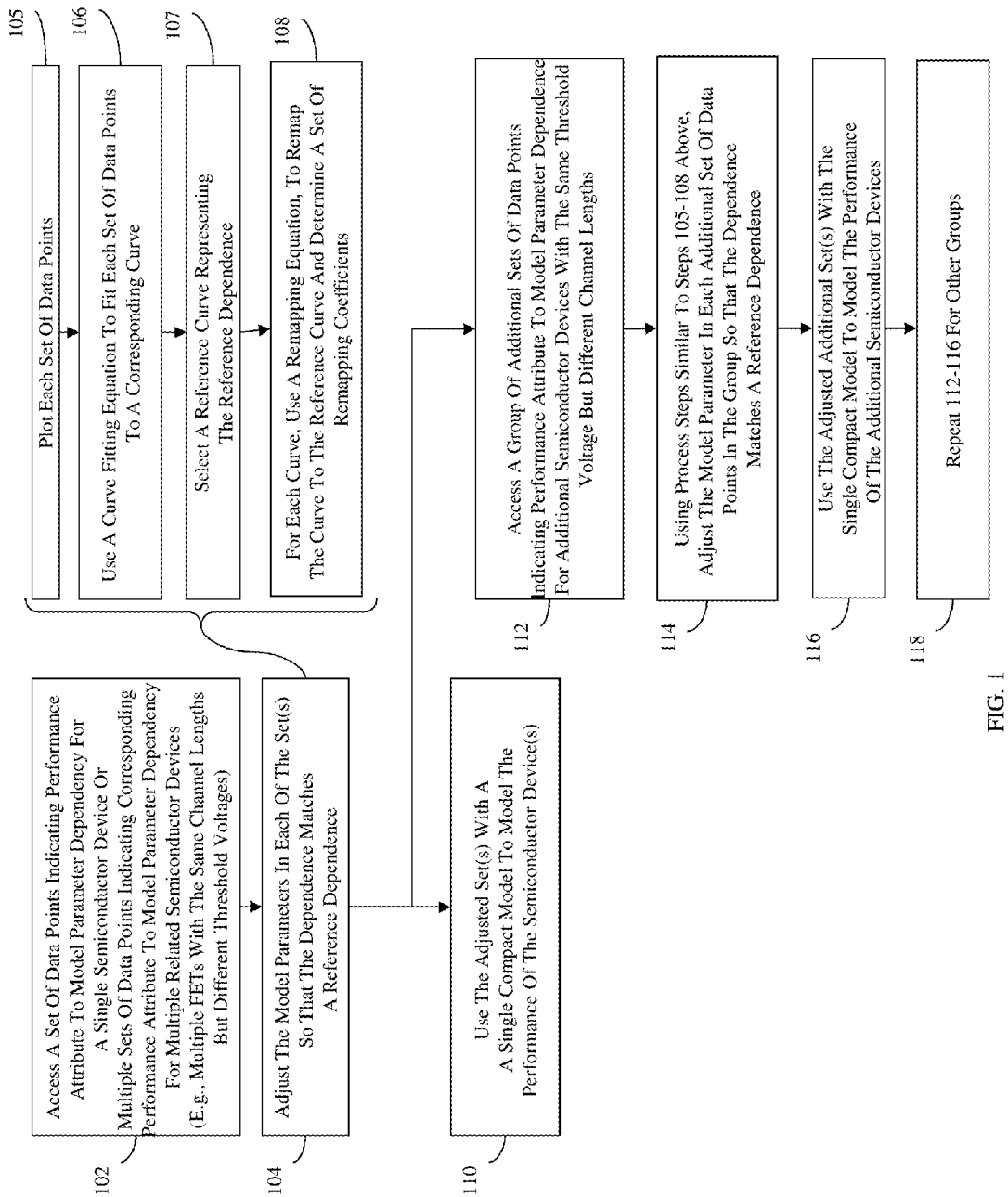
FIG. 1 is a flow diagram illustrating an embodiment of a method for modeling semiconductor device performance.

As mentioned above, oftentimes in integrated circuit design, semiconductor device performance and, particularly, field effect transistor (FET) performance, is optimized through the use of strain engineering. For example, strain engineering can be used to alter charge carrier mobility in the channel region of a FET and, thereby alter a performance attribute (e.g., linear drain current (Idlin)) of the FET. However, since the strain imparted on a FET channel region can vary as a function of the FET's proximity to other structures (e.g., isolation regions) or other devices in the design layout, the charge carrier mobility of essentially identical FETs and, thereby the performance of those FETs can vary as a function of placement. This phenomenon is referred to as the local layout effect (LLE).

Many compact models incorporate equations that use mobility multipliers in an attempt to account for local layout effects (LLEs). These equations typically assume that variations of linear drain current (Idlin) (e.g., as indicated by a percentage change) as a function of variations in mobility (e.g., as indicated by a mobility multiplier) will be essentially the same for related FETs (i.e., for all FETs of the same type, such as for all P-type field effect transistors (PFETs) or all N-type field effect transistors (NFETs), having essentially the same geometry, but different threshold voltages). However, it has been found that the linear drain current (Idlin) to mobility (u0) dependency can vary significantly for a given FET model during model fitting and centering, and can vary significantly between related FET models depending on the choice of fitting parameters used to fit each model. Similar results have been found with regard to the dependence of other performance attribute to model parameter dependencies (e.g., the percentage change in saturation drain current (Idsat) as a function of saturation velocity (Vsat)). Thus, the compact model being used to model FET performance must be selectively adjusted during fitting and/or centering for a single FET, or for each of the related FETs or, alternatively, different compact models must be used for each of the related FETs. Unfortunately, such solutions can be time-consuming and costly. Therefore, it would be advantageous to provide a technique that allows the same compact model to be used, without selective adjustments, despite changes in performance attribute to model parameter dependency of a single semiconductor device due to local layout effects during fitting and/or re-centering and/or despite variations in performance attribute to model parameter dependency across multiple related semiconductor devices.

In view of the foregoing, disclosed herein are embodiments of a method, system and program storage device for modeling semiconductor device performance using a single compact model, without selective adjustments, despite changes in performance attribute to model parameter dependency of a single semiconductor device (e.g., despite changes in linear drain current (Idlin) to mobility (u0) dependency of a field effect transistor (FET) or changes in saturation drain current (Idsat) to saturation velocity (Vsat) dependency of a FET) that occur during fitting and/or re-centering due to local layout effects (LLEs) and/or despite variations in performance attribute to model parameter dependency across multiple related semiconductor devices (e.g., despite variations in linear drain current (Idlin) to mobility (u0) dependency across related FETs or variations in saturation drain current (Idsat) to saturation velocity (Vsat) dependency across related FETs) due to local layout effects (LLEs). Specifically, the actual performance attribute to model parameter dependence of a single semiconductor device can be fit to a reference dependence so that changes to the compact model used to model performance are not required even when changes occur in the performance attribute to model parameter dependency during fitting and/or re-centering. Furthermore, the actual performance attribute to model parameter dependence of each of multiple related semiconductor devices can be fit to a reference dependence so that changes to the compact model used to model performance are not required even when the performance attribute to model parameter dependency varies across the devices. In this case, the reference dependence can optionally be the performance attribute to model parameter dependence of a selected one of the related semiconductor devices.

More particularly, referring to FIG. 1, disclosed herein are embodiments of a computer-implemented method for modeling semiconductor device performance.

The method can comprise accessing (e.g., by a computer from a memory device) a single set of data points for a single semiconductor device and, optionally, multiple sets of data points for multiple related semiconductor devices (102).

It should be understood that, as used herein, the term "related semiconductor devices" refers to semiconductor devices of the same type (e.g., all P-type FETs (PFETs) or all N-type FETs (NFETs)) having essentially the same geometry (e.g., the same size in terms of channel length and width), but different threshold voltages (Vt) (e.g., regular threshold voltage (RVT), high threshold voltage (HVT), mezzanine threshold voltage (MVT), super-high threshold voltage (SVT), low threshold voltage (LVT), ultra-high threshold voltage (UVT), etc.). Thus, in the exemplary embodiments described herein the related semiconductor devices are described in terms, for example, of a regular threshold voltage (RVT) transistor, a high threshold voltage (HVT) transistor, a mezzanine threshold voltage (MVT) transistor, a super-high threshold voltage (SVT) transistor, a low threshold voltage (LVT) transistor, an ultra-high threshold voltage (UVT) transistor, etc. Those skilled in the art will recognize that such transistors having essentially the same geometry but different threshold voltages can be achieved as a function, for example, of different doping profiles (e.g., different well doping depths and concentrations, different halo doping depths and concentrations, etc.), different dielectric materials and/or thicknesses, etc.

It should also be noted that in the early stages of new technology node development, data points associated with a semiconductor device (or devices) can be acquired based on assumptions and on measurements taken from hardware in previous technology nodes. Additionally, or alternatively, such data points can be acquired through prototype hardware (i.e., early hardware) measurements. In later stages of design and development, the data points can be acquired from operational hardware measurements.

In any case, each data point in each set of data points stored in memory and accessed at process 102 can indicate the dependence of a performance attribute of a corresponding semiconductor device on a model parameter. For example, each data point can indicate the percentage change in the performance attribute as a function of a multiplier that is associated with the model parameter. Those skilled in the art will recognize that a multiplier for a model parameter is a factor that is used to increase or decrease the value of the model parameter. For example, a multiplier of 1 is a nominal multiplier that does not change the value of the model parameter, a multiplier of greater than 1 increases the value of the model parameter and a multiplier of less than one decreases the value of the model parameter.

In one embodiment as disclosed herein, the semiconductor device(s) can comprise field effect transistor(s) (FET(s)), the performance attribute can comprise the linear drain current (Idlin) and the model parameter can comprise charge carrier mobility (u0) within the channel region of the FET. In another embodiment, the semiconductor device(s) can comprise field effect transistor(s) (FET(s)), the performance attribute can comprise saturation drain current (Idsat) and the model parameter can comprise saturation velocity (Vsat) (i.e., the maximum velocity a charge carrier in the channel region of the FET attains in the presence of high electric fields). Regardless of whether the performance attribute is linear drain current (Idlin) or saturation drain current (Idsat) or whether the model parameter is charge carrier mobility or saturation velocity, respectively, as discussed above the performance attribute to model parameter dependency may change and/or may vary across related FETs (e.g., due to local layout effects (LLEs)).

In the case of a single semiconductor device, to compensate for any changes in the performance attribute to model parameter dependency (e.g., to compensate for any changes in the linear drain current (Idlin) to mobility (u0) dependency of a single FET or to compensate for any changes in the saturation drain current (Idsat) to saturation velocity (Vsat) dependency of a single FET), which occur during fitting and/or re-centering due to local layout effects (LLEs), the method can comprise adjusting (e.g., by the computer) the model parameter in the set so that the performance attribute to model parameter dependence matches a reference dependence (104). By fitting the actual performance attribute to model parameter dependence of the semiconductor device to a reference dependence, changes to the compact model used to model performance are not required even when changes occur in the performance attribute to model parameter dependency during fitting and/or re-centering.

In the case of multiple related semiconductor devices, to compensate for variations in performance attribute to model parameter dependency across the multiple related semiconductor devices (e.g., to compensate for any variations in the linear drain current (Idlin) to mobility (u0) dependency across multiple related FETs or to compensate for any variations in the saturation drain current (Idsat) to saturation velocity (Vsat) dependency across multiple related FETs), the method can comprise adjusting (e.g., by the computer) model parameter in each of the multiple sets of data points such that, for all of the multiple related semiconductor devices, the corresponding performance attribute to model parameter dependence matches the reference dependence (104). Thus, following process 104, performance attribute to model parameter dependence will be the same for all the related semiconductor devices. Optionally, this reference dependence can be the corresponding dependence of a selected one of the semiconductor devices. By fitting the actual performance attribute to model parameter dependence of each semiconductor device to the reference dependence, changes to the compact model used to model performance are not required even when the performance attribute to model parameter dependency varies across the devices.

In either case, this adjusting process 104 can be accomplished by first plotting the set(s) of data points in a graph. Then, using a fitting equation, the set(s) of data points on the graph can be fit to corresponding curve(s) such that each curve is associated with a corresponding semiconductor device (105-106). Thus, in the case of multiple related field effect transistor (FETs), each curve can be associated with a different threshold voltage but can have the same channel length.

Figure 2:
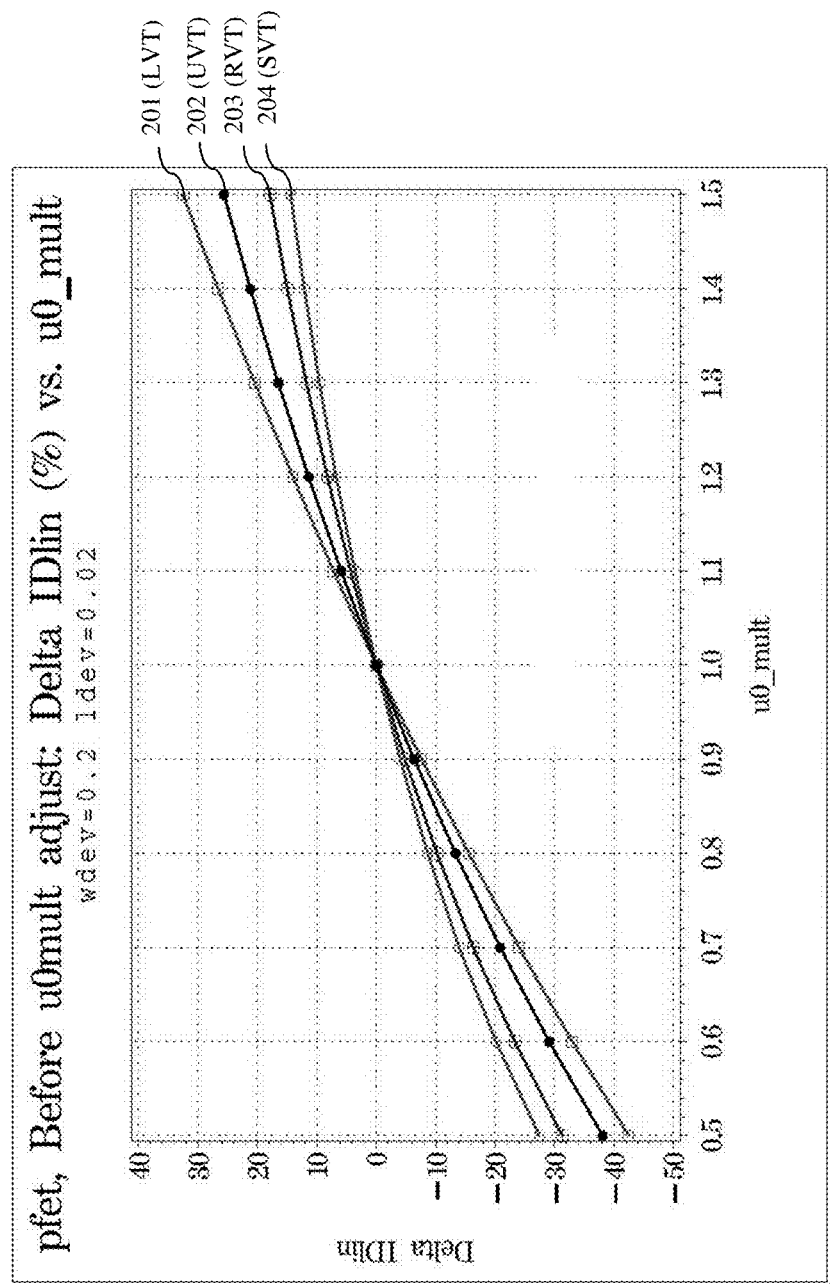
FIG. 2 is a graph illustrating curves representing the dependency of linear drain current (Idlin) on mobility for related field effect transistors (FETs) having different threshold voltages, but the same channel length.

For example, as illustrated in FIG. 2, sets of data points, which indicate the percentage change in linear drain current (Idlin) on the y-axis as a function of a multiplier for mobility (u0_mult) on the x-axis. Each set of data points can be fit to a corresponding curve and each curve can be associated with a different field effect transistors (FETs) (e.g., a low threshold voltage (LVT) transistor (see curve 201), an ultra-high threshold voltage (UVT) transistor (see curve 202), a regular threshold voltage (RVT) (see curve 203), and a super-low threshold voltage (SVT) transistor (see curve 204)). Finally, each of these field effect transistors can be related in that they have the same channel length (e.g., L=0.02 microns). As shown by the curves 201-204, the dependency of linear drain current (Idlin) on mobility is different for the different FETs.

An exemplary curve-fitting equation that could be used at process 105-106 is as follows:

$$\text{Delta\_Idlin} = A0 + A1 * u0\_mult + A2 * (u0\_mult)^2 + A3 * (u0\_mult)^3,$$

where Delta_Idlin is the percentage change in linear drain current (Idlin), u0_mult is the mobility multiplier, and A0, A1, A2 and A3 are the set of curve-fitting coefficients that must be determined at process 106 for each of the sets of data points. Alternatively, any other suitable curve-fitting equation could be used.

Next, a reference curve can be selected to represent the reference dependence (107). For example, a completely new curve can be selected as the reference curve at process 107. Alternatively, in the case of multiple related semiconductor devices, one of the curves 201-204 into which the data points were fit at process 106 can be selected as the reference curve. This selection can be based on user input, can be random, or, alternatively, could be based on some established criteria (e.g., the curve that shows the least amount of dependency in terms of performance attribute changes with changes mobility, see curve 202).

Each of the curve(s) generated based on the set(s) of data points at process 106 (e.g., see curves 201-204) can then be remapped, as necessary, to the reference curve selected at process 107 (108). That is, for each curve (i.e., for a single curve associated with a single set of data points for a single semiconductor device or for each of multiple curves associated with corresponding sets of data points for multiple related semiconductor devices), a curve-remapping equation can be used to determine a set of remapping coefficients that, when applied, will adjust the curve so that it matches (i.e., overlays) the reference curve and, thereby so that the performance attribute to model parameter dependence matches the reference dependence.

Figure 3:
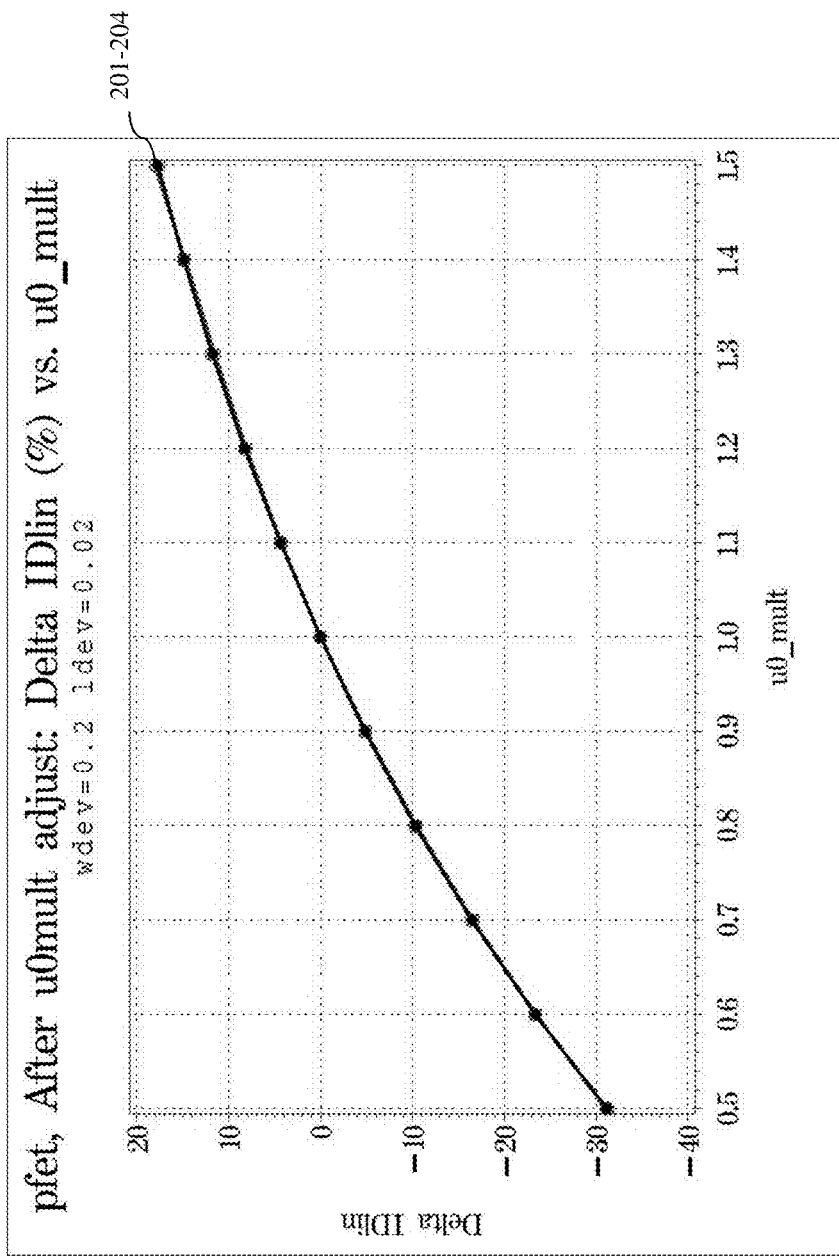
FIG. 3 is a graph illustrating the remapping of the curves of FIG. 2 to a reference curve.

For example, as illustrated in FIG. 3, the linear drain current (Idlin) to mobility multiplier (u0_mult) dependency curves 201, 203 and 204 can be remapped to the selected reference curve 202 such that the curves 201, 203, and 204 overlay the reference curve 202.

An exemplary remapping equation that can be used at process 108 to determine the remapping coefficients is as follows:

$$u0\_mult\_raw = \text{Value calculated by LLE Model,}$$

$$u0\_mult = 1.0 + (k\_u1\_mob * (u0\_mult\_raw - 1.0) + k\_u2\_mob * (u0\_mult\_raw - 1.0)^2), \text{ and}$$

$$rdelidl = ra0 + ra1 * u0\_mult + ra2 * (u0\_mult)^2 + ra3 * (u0\_mult)^3,$$

where rdelidl, ra0, ra1, ra2, ra3 are the values of the reference remapping coefficients associated with the reference curve,
where $$rdelidl = a0 +$$

$$a1 * (1.0 + k\_u1\_mob * (u0\_mult - 1.0) + k\_u2\_mob * (u0\_mult - 1.0)^2) +$$

$$a2 * (1.0 + k\_u1\_mob * (u0\_mult - 1.0) + k\_u2\_mob * (u0\_mult - 1.0)^2)^2 +$$

$$a3 * (1.0 + k\_u1\_mob * (u0\_mult - 1.0) + k\_u2\_mob * (u0\_mult - 1.0)^2)^3,$$

where a0, a1, a2, a3 are values from the best fit of the delta_idlin vs. u0_mult curve, and where k_u1_mob and k_u2_mob are the fitting parameters to remap u0_mult dependence to match the reference curve. Alternatively, any other suitable curve-remapping equation could be used.

Following re-mapping at process 108, the adjusted set(s) of data points (i.e., the set(s) of data points with the model parameter adjusted) can be used by the same compact model to model the performance of the semiconductor device(s), without making selective adjustments to the compact model itself (110). That is, when modeling the performance of a single semiconductor device that exhibits changes in the performance attribute to model parameter dependency during fitting or re-centering due to local layout effects (LLEs), the adjusted set of data points can be used as opposed to making time consuming and costly selective changes to the compact model. Furthermore, when modeling the performance of multiple related semiconductor devices that exhibit variations in performance attribute to model parameter dependency due to local layout effects (LLEs), the adjusted sets of data points can be used as opposed to making time consuming and costly selective changes to the compact model.

Additionally, once the sets of data points for related semiconductor devices (i.e., for semiconductor devices of the same type and having essentially the same geometry, but different threshold voltages (Vt)) are adjusted at process 104, as discussed above, additional process steps can be performed in order to be able to use this same compact model to model the performance of semiconductor devices having both different threshold voltages and different geometries (e.g., different channel lengths), again without making selective adjustments to the compact model itself.

More specifically, groups of additional sets of data points can be stored in memory. All of the additional sets of data points in a given group can be associated with additional semiconductor devices all having the same threshold voltage and, particularly, the same threshold voltage as one of the related semiconductor devices. However, the data points in the different sets of data points within a given group will be associated with additional semiconductor devices that have different channel lengths. Once the data points in the initial sets of data points are fit into curves at process 106 and the curves are remapped, as necessary, to the reference curve at process 108, one group of additional sets of data points for multiple additional semiconductor devices can be accessed (112). Using processes similar to the processes 105-108 described above, the model parameters for the data points in the additional sets in this group can be adjusted in order to achieve dependency matching (114).

Specifically, the data points in the additional sets of data points in a group can be fit to additional curves using a curve-fitting equation. This curve-fitting equation can comprise, for example, the same curve-fitting equation used at process 106, as discussed above, such that each additional curve is associated with a corresponding one of the additional semiconductor devices and, thereby associated with a different channel length. Then, the additional curves can be remapped, by the computer, to the reference curve using an additional curve-remapping equation.

Figure 4A:
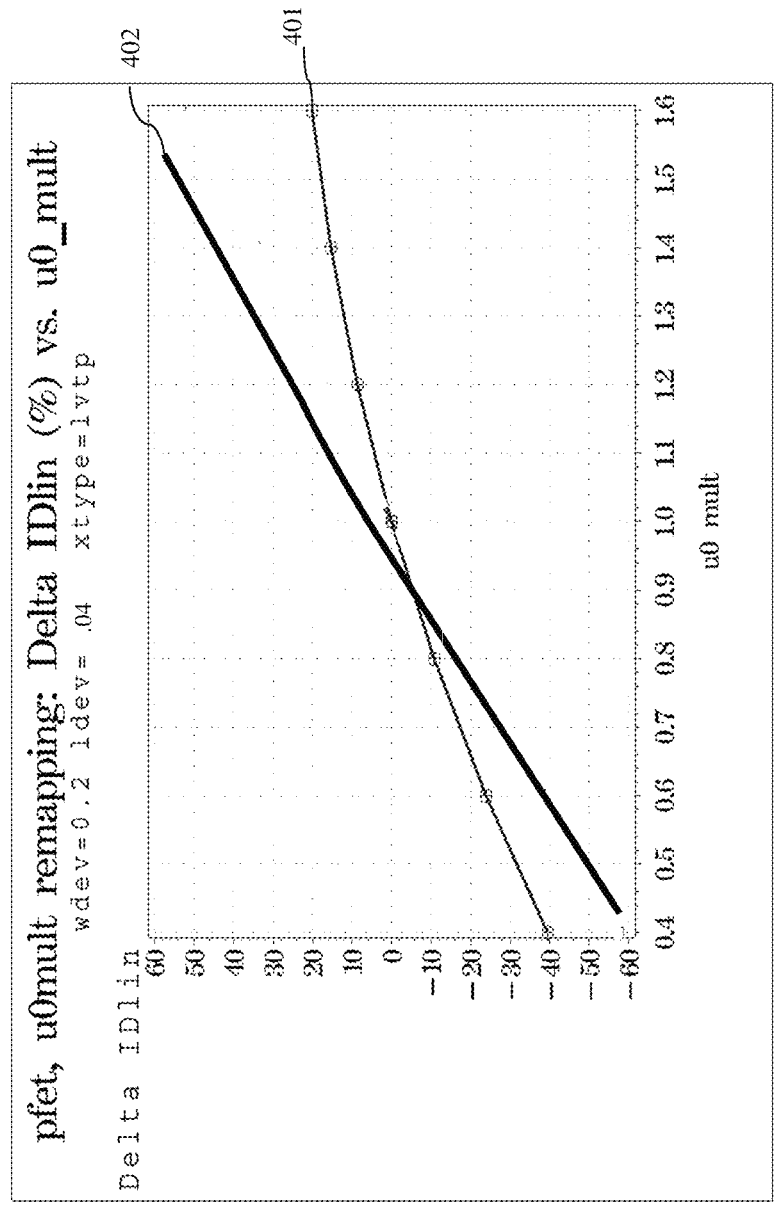
FIG. 4A is a graph illustrating the reference curve and another curve representing the dependency of linear drain current (Idlin) on mobility for a field effect transistor (FET) having the same threshold voltage as a selected one of the curves in FIG. 2, but a different channel length.
Figure 4B:
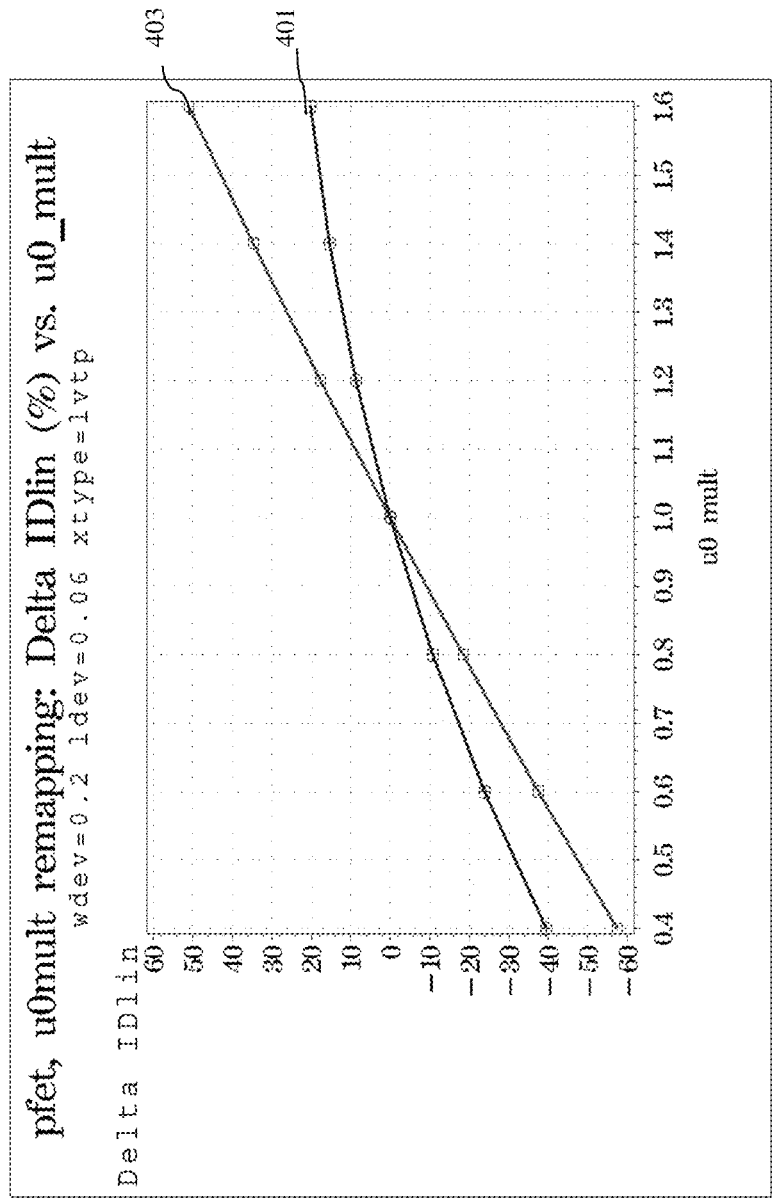
FIG. 4B is a graph illustrating the reference curve and another curve representing the dependency of linear drain current (Idlin) on mobility for a field effect transistor (FET) having the same threshold voltage as the selected curve from FIG. 2, but another different channel length.

For example, FIGS. 4A and 4B, each show curve 401, which represents the reference curve. This reference curve is that curve to which all other curves were previously remapped at process 108 and, particularly, to which the performance attribute to model parameter dependence associated with the low threshold voltage (LVT) transistor was remapped. FIG. 4A further illustrates an additional curve 402 associated with an additional set of data points associated with a low threshold voltage (LVT) transistor having a different channel length (e.g., L=0.04). FIG. 4B further illustrates another additional curve 403 associated with another additional set of data points associated with a low threshold voltage (LVT) transistor having yet a different channel length (e.g., L=0.06). As shown by the curves 402 and 403, the dependency of linear drain current (Idlin) on mobility is different for these different field effect transistors, due to the different channel lengths. Next, in the same manner as described above with regard to process step 108, the curve 402 of FIG. 4A and the curve 403 of FIG. 4B can be remapped to the reference curve 401. That is, for each curve 402 and 403, a curve-remapping equation can be used to determine a set of remapping coefficients that, when applied, will adjust the curve so that it matches (i.e., overlays) the reference curve 401.

An exemplary remapping equation that can be used in this case to determine the remapping coefficients for a curve associated with a specific threshold voltage and channel length is as follows:

$$k\_u1\_mob = u1a + \frac{u1b}{(Ldesign + u1c)}$$

$$k\_u2\_mob = u2a + \frac{u2b}{(Ldesign + u2c)},$$

where k_u1_mob and k_u2_mob are values determined at process 108 described in detail above for a related semiconductor device having a specific threshold voltage and u1a, u1b, u1c, u2a, u2b, u2c are values further determined at this process step for the remapping coefficients associated with an additional semiconductor device having the same specific threshold voltage but a different channel length. Thus, when channel length is considered in addition to threshold voltage, this equation requires that six total remapping coefficients must be determined to compensate for any mobility dependence differences. More specifically, only two are needed for a single L: k_u1_mob and k_u2_mob; whereas six (e.g., u1a, u2a, etc.) are needed to generate unique values of k_u1_mob and k_u2_mob for each of multiple Ls.

The adjusted additional sets of data points (i.e., the additional sets of data points with the model parameter adjusted) can then be used with the single compact model in order to model the performance of the additional semiconductor devices (116).

The processes 112-116 can further be repeated for each group of additional sets of data points stored in memory (118). That is, the method can further comprise repeating, by the computer, the process of accessing the additional sets of data points for a given group, the process of fitting the additional sets of data points to the additional curves, and the process of remapping the additional curves to the reference curve. Thus, the method embodiments provide for model parameter adjustment across semiconductor devices having different threshold voltages and different geometries (e.g., different channel lengths), thereby ensuring that the same compact model can be used to model the performance of related semiconductor devices (i.e., semiconductor devices with the same geometries but different threshold voltages) and other semiconductor devices (e.g., semiconductor devices with different geometries and, particularly, different channel lengths).

It should be noted that for illustration purposes the process steps are described above with reference to examples. In these examples, the performance attribute is described as being linear drain current (Idlin) and the model parameter is described as being mobility. However, it should be understood that essentially the same process steps can be used to model the performance of any related semiconductor devices where a performance attribute to model parameter dependency varies (e.g., where saturation drain current (Idsat) to saturation velocity (Vsat) dependency varies). It should further be understood that the method embodiments described above could be implemented, in whole or in part, in a computer hardware environment (e.g., a computer system) such as that described in detail below and depicted in FIG. 6. Alternatively, the method embodiments could be implemented on any other computerized device having the required data storage and processing capability to perform the described curve-fitting and curve-remapping processes (e.g., a laptop computer, tablet computer, handheld device, smart phone, etc.).

Figure 5:
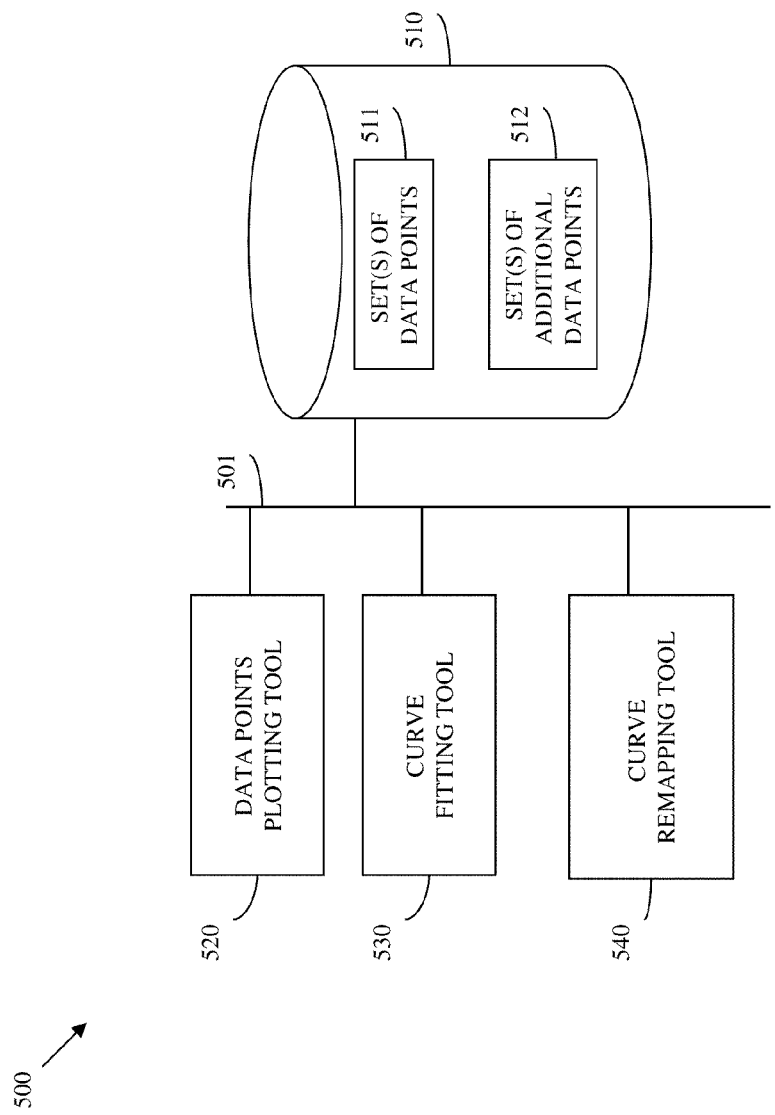
FIG. 5 is a schematic diagram illustrating an embodiment of a system for modeling semiconductor device performance.

Referring to FIG. 5, also disclosed herein are embodiments of a computer system 500 for modeling semiconductor device performance. The computer system 500 embodiments can comprise one or more memory devices 510 and one or more computer processing units (i.e., processors) (e.g., a data points plotting tool 520, a curve-fitting tool 530 and a curve-remapping tool 540) in communication with the memory device(s) (e.g., over a system bus 501).

The memory 510 can store (i.e., can be adapted to store, can be configured to store, etc.) a single set of data points 511 for a single semiconductor device and, optionally, multiple sets of data points 511 for multiple related semiconductor devices.

It should be understood that, as used herein, the term "related semiconductor devices" refers to semiconductor devices of the same type (e.g., all P-type FETs (PFETs) or all N-type FETs (NFETs)) having essentially the same geometry (e.g., the same size in terms of channel length and width), but different threshold voltages (Vt) (e.g., regular threshold voltage (RVT), high threshold voltage (HVT), mezzanine threshold voltage (MVT), super-high threshold voltage (SVT), low threshold voltage (LVT), ultra-high threshold voltage (UVT), etc.). Thus, in the exemplary embodiments described herein the related semiconductor devices are described in terms, for example, of a regular threshold voltage (RVT) transistor, a high threshold voltage (HVT) transistor, a mezzanine threshold voltage (MVT) transistor, a super-high threshold voltage (SVT) transistor, a low threshold voltage (LVT) transistor, an ultra-high threshold voltage (UVT) transistor, etc. Those skilled in the art will recognize that such transistors having essentially the same geometry but different threshold voltages can be achieved as a function, for example, of different doping profiles (e.g., different well doping depths and concentrations, different halo doping depths and concentrations, etc.), different dielectric materials and/or thicknesses, etc.

It should also be noted that in the early stages of new technology node development, data points associated with a semiconductor device (or with multiple related semiconductor devices) can be acquired based on assumptions and on measurements taken from hardware in previous technology nodes. Additionally, or alternatively, such data points can be acquired through prototype hardware (i.e., early hardware) measurements. In later stages of design and development, the data points can be acquired from operational hardware measurements.

In any case, each data point in each set of data points accessed stored in memory can indicate the dependence of a model parameter on a performance attribute of a corresponding semiconductor device. For example, each data point can indicate the percentage change in the performance attribute as a function of a multiplier that is associated with the model parameter. Those skilled in the art will recognize that a multiplier for a model parameter is a factor that is used to increase or decrease the value of the model parameter. For example, a multiplier of 1 is a nominal multiplier that does not change the value of the model parameter, a multiplier of greater than 1 increases the value of the model parameter and a multiplier of less than one decreases the value of the model parameter.

In one embodiment as disclosed herein, the performance attribute can comprise the linear drain current (Idlin) of a field effect transistor (FET) and the model parameter can comprise charge carrier mobility within the channel region of the FET. In another embodiment, the performance attribute can comprise saturation drain current (Idsat) of a field effect transistor (FET) and the model parameter can comprise saturation velocity (Vsat) (i.e., the maximum velocity a charge carrier in the channel region of the FET attains in the presence of high electric fields). Regardless of whether the performance attribute linear drain current (Idlin) or saturation drain current (Idsat) or whether the model parameter is charge carrier mobility or saturation velocity, respectively, for different semiconductor devices the dependence of the performance attribute on the model parameter will be different (e.g., due to local layout effects (LLEs).

In the case of a single semiconductor device, to compensate for any changes in the performance attribute to model parameter dependency of a single field semiconductor device (e.g., any changes in the linear drain current (Idlin) to mobility (u0) dependency of a FET or any changes in the saturation drain current (Idsat) to saturation velocity (Vsat) dependency of a FET), which occur during fitting and/or re-centering due to local layout effects (LLEs), the processor(s) 510, 520, and 530 can operate to adjust the model parameter in the set so that the dependence matches a reference dependence. By fitting the actual performance attribute to model parameter dependence of the semiconductor device to a reference dependence, changes to the compact model used to model performance are not required even when changes occur in the performance attribute to model parameter dependency during fitting and/or re-centering.

In the case of multiple related semiconductor devices, to compensate for variations in the performance attribute to model parameter dependency across multiple related semiconductor devices (e.g., any variations in the linear drain current (Idlin) to mobility (u0) dependency across related FETs or any variations in the saturation drain current (Idsat) to saturation velocity (Vsat) dependency across related FETs), which occur due to local layout effects (LLEs), the processor(s) 510, 520, and 530 can operate to adjust each of the multiple sets of data points such that, for all of the multiple related semiconductor devices, the corresponding dependence matches the reference dependence (i.e., such that the dependence of the performance attribute on the model parameter is the same for the different semiconductor devices). Optionally, this reference dependence can be the corresponding dependence of a selected one of the semiconductor devices. By fitting the actual performance attribute to model parameter dependence of each semiconductor device to the reference dependence, changes to the compact model used to model performance are not required even when the performance attribute to model parameter dependency varies across the devices.

Specifically, the data points plotting tool 520 can access and plot in a graph (i.e., can be adapted to access and plot in a graph, can be configured to access and plot in a graph, can be programmed to access and plot in a graph, etc.) the set(s) of data points 511.

The curve-fitting tool 530 can use (i.e., can be adapted to use, can be configured to use, can be programmed to use, etc.) a fitting equation to fit the set(s) of data points to curve(s) such that each curve is associated with a corresponding semiconductor device. Thus, in the case of multiple related semiconductor devices, each curve will be associated with a different threshold voltage.

For example, as illustrated in FIG. 2, sets of data points, indicating the percentage change in linear drain current (Idlin) on the y-axis as a function of a multiplier for mobility (u0_mult) on the x-axis can be associated with the following, all of which have a same channel length (e.g., L=0.02 microns) and can be fit to curves 201, 202, 203 and 204, respectively: a low threshold voltage (LVT) transistor, an ultra-high threshold voltage (UVT) transistor, a regular threshold voltage (RVT), and a super-low threshold voltage (SVT) transistor. As shown by these curves 201-204, the dependency of linear drain current (Idlin) on mobility is different for the different transistors. It should be noted that an exemplary curve-fitting equation that could be used by the curve-fitting tool 530 is discussed in detail above with regard to the method embodiments.

The curve-remapping tool 540 can select (i.e., can be adapted to select, can be configured to select, can be programmed to select, etc.) a reference curve to represent that reference dependence. For example, the curve-remapping tool 540 can select a completely new reference curve. Alternatively, in the case of multiple related semiconductor devices, the curve-remapping tool 540 can select one of the curves 201-204 as a reference curve. This selection process can be based on user input, can be random, or can be based on some established criteria (e.g., the curve which shows the least amount of dependency in terms of changes in the performance as a function of changes in the model parameter, see curve 202).

The curve-remapping tool 540 can further remap (i.e., can be adapted to remap, can be configured to remap, can be programmed to remap, etc.) the curve(s), which were previously processed by the curve-fitting tool 530 (e.g., see curves 201-204), to the reference curve. That is, for each curve processed by the curve-fitting tool 30, the curve-remapping tool 540 can use a curve-remapping equation to determine a set of remapping coefficients that, when applied, will adjust each curve so that it matches (i.e., overlays) the reference curve. For example, as illustrated in FIG. 3, the linear drain current (Idlin) to mobility multiplier (u0_mult) curves 201, 203 and 204 can be remapped to a selected reference curve 202 such that the curves 201, 203, and 204 overlay the curve 202. It should be noted that an exemplary curve-remapping equation that could be used by the curve-remapping tool 540 is discussed in detail above with regard to the method embodiments. It should also be noted that there could be a different reference curve selected for each device, if needed. For example, the user could optionally adjust the reference curve based on the threshold voltage (Vt).

Following processing by the curve-fitting and remapping tools 530-540, the adjusted set(s) of data points 511 (i.e., the set(s) of data points with the model parameter adjusted) can be used by the same compact model to model performance of the semiconductor device(s), without making selective adjustments to the compact model itself (110). That is, when modeling the performance of a single semiconductor device that exhibits changes in the performance attribute to model parameter dependency during fitting or re-centering due to local layout effects (LLEs), the adjusted set of data points can be used as opposed to making time consuming and costly selective changes to the compact model. Furthermore, when modeling the performance of multiple related semiconductor devices that exhibit variations in performance attribute to model parameter dependency due to local layout effects (LLEs), the adjusted sets of data points can be used as opposed to making time consuming and costly selective changes to the compact model.

Additionally, once the sets of data points for related semiconductor devices (i.e., for semiconductor devices of the same type and having essentially the same geometry, but different threshold voltages (Vt)) are adjusted, as discussed above, additional process steps can be performed by the tools 520, 530 and 540 in order to be able to use this same compact model to model the performance of semiconductor devices having both different threshold voltages and different geometries (e.g., different channel lengths).

More specifically, groups of additional sets 512 of data points can be stored in memory 510. All of the additional sets of data points in a given group can be associated with additional semiconductor devices having the same specific threshold voltage and, particularly, the same threshold voltage as one of the related semiconductor devices. However, the data points in the different sets of data points within a given group will be associated with additional semiconductor devices that have different channel lengths. Once the data points in the initial sets of data points are fit into curves by the curve-fitting tool 530 and the curves are remapped, as necessary, to the reference curve by the curve-remapping tool 540, one group of additional sets of data points for multiple additional semiconductor devices can be accessed and using processes similar to those described above, the model parameters for the data points in the additional sets in this group can be adjusted by the tools 520, 530 and 540 in order to achieve dependency matching.

Specifically, the data points plotting tool 520 can access and plot (i.e., can be adapted to access and plot, can be configured to access and plot, can be programmed to access and plot, etc.) the data points in the additional sets of data points in this group into a graph. The curve-fitting tool 530 can fit (i.e., can be adapted to fit, can be configured to fit, can be programmed to fit, etc.) the data points in the additional sets of data points into additional curves using a curve-fitting equation (e.g., the same curve-fitting equation used in the previous curve-fitting process as discussed above) such that each additional curve is associated with a corresponding one of the additional semiconductor devices and, thereby associated with a different channel length. Then, the curve-remapping tool 540 can remap (i.e., can be adapted to remap, can be configured to remap, can be programmed to remap, etc.) the additional curves to the reference curve using an additional curve-remapping equation. It should be noted that an exemplary additional curve-remapping equation that can be used by the curve-remapping tool 540 to determine the remapping coefficients for a curve associated with a specific threshold voltage and channel length is discussed in detail above with regard to the method embodiments.

The adjusted model parameters can then be used with the single compact model in order to model the performance of the additional semiconductor devices having the same specific threshold voltage, but different channel lengths.

The data points plotting tool 520, the curve-fitting tool 530 and the curve-remapping tool 540 can further repeat the above-described processes for each group of additional sets of data points stored in memory 510. That is, the process of accessing the additional sets of data points for a given group, the process of fitting the additional sets of data points to the additional curves, and the process of remapping the additional curves to the reference curve can be iteratively repeated by the tools 520, 530 and 540 for each group of additional sets of data. Thus, the embodiments provide for model parameter adjustment across semiconductor devices having different threshold voltages and different geometries (e.g., different channel lengths), thereby ensuring that the same compact model can be used to model the performance of related semiconductor devices (i.e., semiconductor devices with the same geometries but different threshold voltages) and other semiconductor devices (e.g., semiconductor devices with different geometries and, particularly, different channel lengths).

It should be understood that the computer system embodiments described above could be implemented, in whole or in part, in a computer hardware environment (e.g., a computer system) such as that described in detail below and depicted in FIG. 6. Alternatively, the computer system embodiments could be implemented on any other computerized device having the required data storage and processing capability to perform the described curve-fitting and curve-remapping processes (e.g., a laptop computer, tablet computer, handheld device, smart phone, etc.).

Also disclosed herein are embodiments of a computer program product. This computer program product can comprise a computer readable medium having computer readable program code embodied therewith. The computer readable program code can be executable by a computer to perform the above-described method of modeling semiconductor device performance. More particularly, as will be appreciated by one skilled in the art, aspects of disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed embodiments may take the form of a computer program product embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
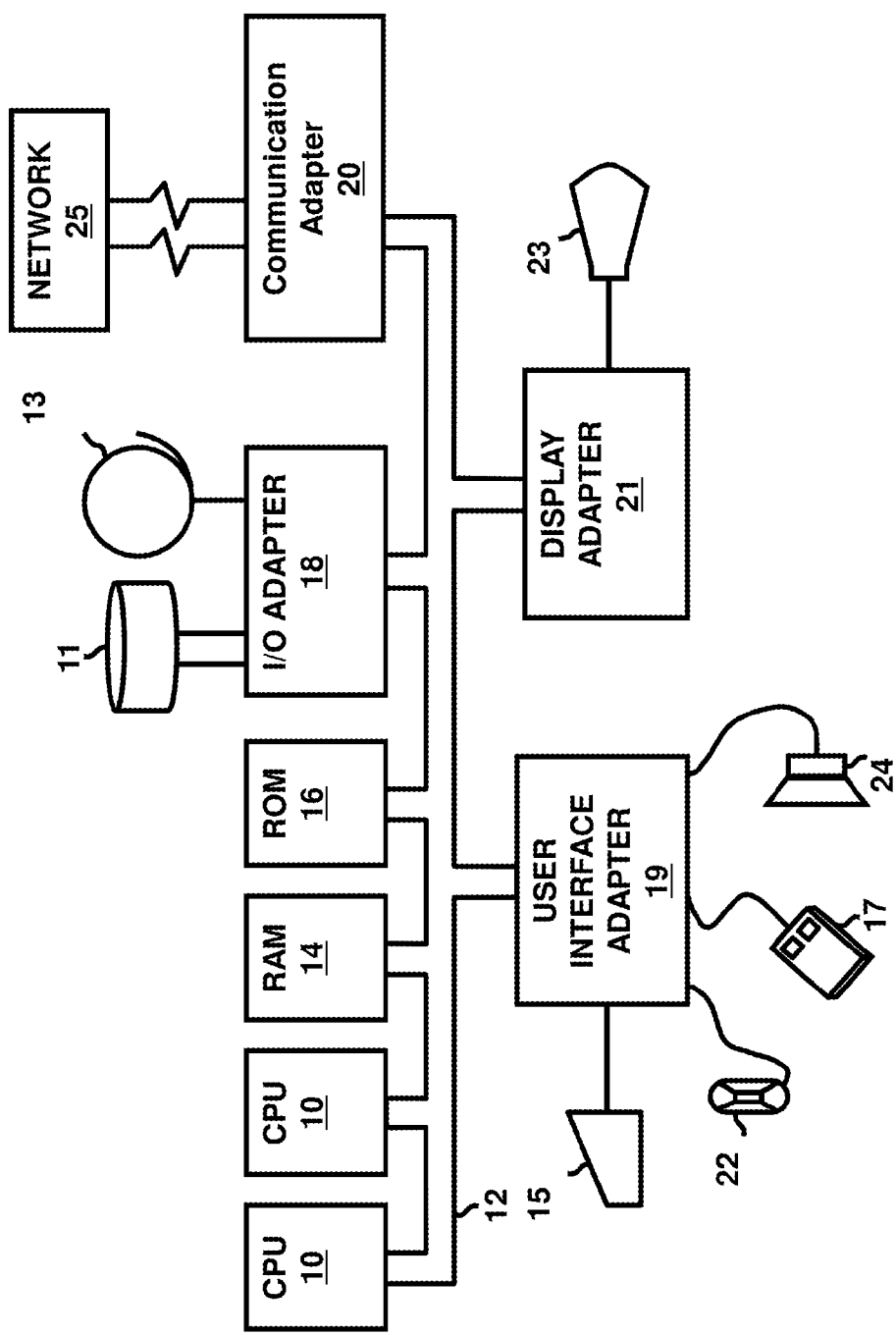
FIG. 6 is a schematic diagram illustrating an exemplary hardware environment that can be used to implement the embodiments disclosed herein.

A representative hardware environment for practicing the method, system and program storage device embodiments, as described in detail above, is depicted in FIG. 6. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a method, system and program storage device for modeling semiconductor device performance using a single compact model, without selective adjustments, despite changes in performance attribute to model parameter dependency of a single semiconductor device (e.g., despite changes in linear drain current (Idlin) to mobility (u0) dependency of a field effect transistor (FET) or changes in saturation drain current (Idsat) to saturation velocity (Vsat) dependency of a FET) that occur during fitting and/or re-centering due to local layout effects (LLEs) and/or despite variations in performance attribute to model parameter dependency across multiple related semiconductor devices (e.g., despite variations in linear drain current (Idlin) to mobility (u0) dependency across related FETs or variations in saturation drain current (Idsat) to saturation velocity (Vsat) dependency across related FETs) that occur due to local layout effects (LLEs). Specifically, the actual performance attribute to model parameter dependence of a single semiconductor device can be fit to a reference dependence so that changes to the compact model used to model performance are not required even when changes occur in the performance attribute to model parameter dependency during fitting and/or re-centering. Furthermore, the actual performance attribute to model parameter dependence of each of multiple related semiconductor devices can be fit to a reference dependence so that changes to the compact model used to model performance are not required even when the performance attribute to model parameter dependency varies across the devices. In this case, the reference dependence can optionally be the performance attribute to model parameter dependence of a selected one of the related semiconductor devices.

What is claimed is:

1. A computer-implemented method for modeling semiconductor device performance, said method comprising:
  accessing, by a computer, multiple sets of data points for multiple related semiconductor devices, respectively, each set of data points being associated with a corresponding one of said multiple related semiconductor devices and indicating, for said corresponding one of said multiple related semiconductor devices, a corresponding dependence of a performance attribute on a model parameter, said corresponding dependence being different for different ones of said multiple related semiconductor devices due to local layout effects;
  generating, by said computer, multiple adjusted sets of data points for said multiple related semiconductor devices, respectively, by adjusting said model parameter in each of said multiple sets of data points such that, in each of said multiple adjusted sets of data points, said corresponding dependence of said performance attribute on said model parameter matches a reference dependence of said performance attribute on said model parameter;
  accessing, by said computer, only a single compact model; and,
  using, by said computer, said single compact model and said multiple adjusted sets of data points to model performance of all of said multiple related semiconductor devices, said using being performed without adjusting said single compact model.

2. The method of claim 1, said multiple related semiconductor devices comprising field effect transistors, said performance attribute comprising linear drain current (Idlin) and said model parameter comprising mobility.

3. The method of claim 1, said multiple related semiconductor devices comprising field effect transistors, said performance attribute comprising saturation drain current (Idsat) and said model parameter comprising saturation velocity.

4. The method of claim 1, said corresponding dependence being represented by a percentage change in said performance attribute as a function of a change in said model parameter and said change in said model parameter being represented by a multiplier.

5. The method of claim 1, said adjusting comprising:
  fitting, by said computer, said sets of data points to curves using a curve-fitting equation such that each curve is associated with a corresponding semiconductor device; and
  remapping, by said computer, said curves to a reference curve, said remapping comprising, for each one of said semiconductor devices, using a curve-remapping equation to determine a set of remapping coefficients.

6. The method of claim 5, said adjusting further comprising selecting, by said computer, one of said curves as said reference curve.

7. The method of claim 5, said multiple related semiconductor devices all being of a same type, having different threshold voltages, and having essentially the same geometry.

8. The method of claim 7, further comprising:
  accessing, by said computer, additional sets of data points for multiple additional semiconductor devices, said additional semiconductor devices all being of said same type, all having a same threshold voltage, and having different channel lengths;
  fitting, by said computer, said additional sets of data points to additional curves using said curve-fitting equation such that each additional curve is associated with a corresponding additional semiconductor device; and
  remapping, by said computer, said additional curves to said reference curve, said remapping of said additional curves comprising, for each one of said additional semiconductor devices, using an additional curve-remapping equation.

9. The method of claim 8, further comprising: repeating, by said computer, of said accessing of said additional sets of data points, said fitting of said additional sets of data points to said additional curves, and said remapping of said additional curves to said reference curve for multiple groups of additional semiconductor devices, each group having a different threshold voltage.

10. A computer system for modeling semiconductor device performance, said computer system comprising:
a memory storing multiple sets of data points for multiple related semiconductor devices, respectively, each set of data points being associated with a corresponding one of said multiple related semiconductor devices and indicating, for said corresponding one of said multiple related semiconductor devices, a corresponding dependence of a performance attribute on a model parameter, said corresponding dependence being different for different ones of said multiple related semiconductor devices due to local layout effects; and,
at least one processor accessing said multiple sets of data points in said memory and generating multiple adjusted sets of data points for said multiple related semiconductor devices, respectively, by adjusting said model parameter in each of said multiple sets of data points such that, in each of said multiple adjusted sets of data points, said corresponding dependence of said performance attribute on said model parameter matches a reference dependence of said performance attribute on said model parameter,
said at least one processor further using only a single compact model and said multiple adjusted sets of data points to model performance of all of said multiple related semiconductor devices, said using being performed without adjusting said single compact model.

11. The computer system of claim 10, said multiple related semiconductor devices comprising field effect transistors, said performance attribute comprising linear drain current (Idlin) and said model parameter comprising mobility.

12. The computer system of claim 10, said multiple related semiconductor devices comprising field effect transistors, said performance attribute comprising saturation drain current (Idsat) and said model parameter comprising saturation velocity.

13. The computer system of claim 10, said corresponding dependence being represented by a percentage change in said performance attribute as a function of a change in said model parameter and said change in said model parameter being represented by a multiplier.

14. The computer system of claim 10, said processor further performing the following in order to adjust said model parameters:
fitting said sets of data points to curves using a curve-fitting equation such that each curve is associated with a corresponding semiconductor device; and
remapping said curves to a reference curve, said remapping comprising, for each one of said semiconductor devices, using a curve-remapping equation to determine a set of remapping coefficients.

15. The computer system of claim 14, said processor further selecting one of said curves as said reference curve before said remapping.

16. The computer system of claim 14, said multiple related semiconductor devices all being of a same type, having different threshold voltages, and having essentially the same geometry.

17. The computer system of claim 16, said processor further performing the following:
accessing additional sets of data points for multiple additional semiconductor devices, said additional semiconductor devices all being of said same type, all having a same threshold voltage, and having different channel lengths;
fitting said additional sets of data points to additional curves using said curve-fitting equation such that each additional curve is associated with a corresponding additional semiconductor device; and
remapping said additional curves to said reference curve, said remapping of said additional curves comprising, for each one of said additional semiconductor devices, using an additional curve-remapping equation.

18. A computer program product comprising a computer readable storage medium having computer readable program code embodied therewith, said computer readable program code being executable by a computer to perform a method of modeling semiconductor device performance, said method comprising:
accessing multiple sets of data points for multiple related semiconductor devices, respectively, each set of data points being associated with a corresponding one of said multiple related semiconductor devices and indicating, for said corresponding one of said multiple related semiconductor devices, a corresponding dependence of a performance attribute on a model parameter, said corresponding dependence being different for different ones of said multiple related semiconductor devices due to local layout effects;
generating multiple adjusted sets of data points for said multiple related semiconductor devices, respectively, by adjusting said model parameter in each of said multiple sets of data points such that, in each of said multiple adjusted sets of data points, said corresponding dependence of said performance attribute on said model parameter matches a reference dependence of said performance attribute on said model parameter;
accessing only a single compact model; and,
using said single compact model and said multiple adjusted sets of data points to model performance of all of said multiple related semiconductor devices, said using being performed without adjusting said single compact model.

* * * * *